United States Patent
Park et al.

(10) Patent No.: US 10,254,365 B2
(45) Date of Patent: Apr. 9, 2019

(54) MAGNETIC RESONANCE IMAGING APPARATUS AND IMAGE PROCESSING METHOD THEREOF

(71) Applicants: SAMSUNG ELECTRONICS CO., LTD., Suwon-si (KR); KOREA ADVANCED INSTITUTE OF SCIENCE AND TECHNOLOGY, Daejeon (KR)

(72) Inventors: Hyun-wook Park, Daejeon (KR); Dong-chan Kim, Daejeon (KR); Chang-heun Oh, Daejeon (KR); Hyun-seok Seo, Daejeon (KR)

(73) Assignees: SAMSUNG ELECTRONICS CO., LTD., Suwon-si (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 440 days.

(21) Appl. No.: 14/965,959

(22) Filed: Dec. 11, 2015

(65) Prior Publication Data

US 2016/0170002 A1 Jun. 16, 2016

(30) Foreign Application Priority Data

Dec. 11, 2014 (KR) .......................... 10-2014-0178711

(51) Int. Cl.
*G01R 33/56* (2006.01)
*G01R 33/483* (2006.01)
*G01R 33/561* (2006.01)

(52) U.S. Cl.
CPC ...... *G01R 33/4835* (2013.01); *G01R 33/5608* (2013.01); *G01R 33/5611* (2013.01)

(58) Field of Classification Search
USPC ................................................. 600/316, 473
See application file for complete search history.

(56) References Cited

U.S. PATENT DOCUMENTS 6,984,981 B2   1/2006   Tamez-Pena et al.
7,002,344 B2   2/2006   Griswold et al.
(Continued)

FOREIGN PATENT DOCUMENTS

CN   101259018 A   9/2008
CN   102309325 A   1/2012
(Continued)

OTHER PUBLICATIONS

Communication dated Mar. 31, 2016 issued by the International Searching Authority in counterpart International Application No. PCT/KR2015/013320 (PCT/ISA/220, PCT/ISA/210, PCT/ISA/237).

(Continued)

*Primary Examiner* — Melissa J Koval
(74) *Attorney, Agent, or Firm* — Sughrue Mion, PLLC

(57) ABSTRACT

A magnetic resonance imaging apparatus includes a gradient magnetic field controller which applies a spatial encoding gradient to a plurality of slices and applies a gradient magnetic field in a first direction with respect to the plurality of slices, a radio frequency (RF) receiver which receives respective magnetic resonance signals from each of the plurality of slices undersampled in a second direction different from the first direction, and an image processor which generates a respective magnetic resonance image of each of the plurality of slices based on the magnetic resonance signals received from the plurality of slices.

7 Claims, 16 Drawing Sheets

(56) References Cited

U.S. PATENT DOCUMENTS

| | | | |
|---|---|---|---|
| 8,797,032 | B2 | 8/2014 | Ookawa |
| 9,366,741 | B2 | 6/2016 | Jo et al. |
| 9,414,766 | B2 | 8/2016 | Jesmanowicz et al. |
| 9,964,618 | B2 | 5/2018 | Kim et al. |
| 2008/0136411 | A1 | 6/2008 | Miyoshi |
| 2009/0278538 | A1* | 11/2009 | Chen ............... G01R 33/4835 324/309 |
| 2012/0257806 | A1* | 10/2012 | Sheltraw ............. A61B 5/055 382/131 |
| 2013/0099784 | A1* | 4/2013 | Setsompop ........... G01R 33/54 324/309 |
| 2013/0181710 | A1* | 7/2013 | Setsompop ........ G01R 33/4835 324/309 |
| 2014/0070805 | A1 | 3/2014 | Van Der Meulen et al. |
| 2014/0111201 | A1 | 4/2014 | Kim et al. |
| 2014/0132261 | A1 | 5/2014 | Kim et al. |
| 2014/0225612 | A1 | 8/2014 | Poliment et al. |
| 2016/0170002 | A1 | 6/2016 | Park et al. |

FOREIGN PATENT DOCUMENTS

| | | |
|---|---|---|
| CN | 102870000 A | 1/2013 |
| CN | 103649765 A | 3/2014 |
| CN | 103720475 A | 4/2014 |
| CN | 103767705 A | 5/2014 |
| JP | 2014-18571 A | 2/2014 |
| WO | 2016/093577 A1 | 6/2016 |

OTHER PUBLICATIONS

Cho et al., "Total inhomogeneity correction including chemical shifts and susceptibility by view angle titling", Medical Physics, 15, Jan.-Feb. 1988, 6 pages total.

Kim et al., "Increasing parallel imaging performance and correcting field inhomogeneity artifact in MS-CAIPIRINHA using view angle tilting technique (CAIPI-VAT)", Proc. Intl. Soc. Mag. Reson. Med 22, 2014, p. 0648.

Breuer et al., "Controlled Aliasing in Parallel Imaging Results in Higher Acceleration (CAIPIRINHA) for Multi-Slice Imaging", Magnetic Resonance in Medicine, 53, 2005, pp. 684-691.

Setsompop et al., "Blipped-Controlled Aliasing in Parallel Imaging for Simultaneous Multislice Echo Planar Imaging With Reduced g-Factor Penalty", Magnetic Resonance in Medicine, 67, 2012, pp. 1210-1224.

Griswold et al., Generalized Autocalibrating Partially Parallel Acquisitions (GRAPPA), Magnetic Resonance in Medicine, 47, 2002, pp. 1202-1210.

Dongchan Kim et al., Multi-slice imAGe generation using intra-slice paraLLel imaging and Inter-slice shifting 9MAGGULLI), Physics in Medicine & Biology, Feb. 2, 2016, vol. 61, No. 4, pp. 1692-1704, IOP Publishing—Institute of Physics and Engineering in Medicine, XP055430557, (14 pages total).

Communication dated Dec. 11, 2017 by the European Patent Office in counterpart European Patent Application No. 15868064.5.

Communication dated Feb. 2, 2019, issued by the State Intellectual Property Office of P.R. China in counterpart Chinese Application No. 201580067080.5.

* cited by examiner 1000-1

1000-2

1000-3

MAGNETIC RESONANCE IMAGING APPARATUS AND IMAGE PROCESSING METHOD THEREOF

CROSS-REFERENCE TO RELATED APPLICATION

This application claims priority from Korean Patent Application No. 10-2014-0178711, filed on Dec. 11, 2014 in the Korean Intellectual Property Office, the disclosure of which is incorporated herein by reference in its entirety.

BACKGROUND

1. Field

One or more exemplary embodiments relate to a method of acquiring data to generate a magnetic resonance image and generating a magnetic resonance image using a magnetic resonance imaging apparatus, and to a magnetic resonance imaging apparatus which implements the method.

2. Description of the Related Art

Magnetic resonance imaging (MRI) apparatuses photograph an object by using a magnetic field so that three-dimensional (3D) images of, for example, bones, discs, joints, or neurotendinous cords are obtained at a desired angle. Thus, such apparatuses have been widely used for accurate disease diagnosis of many medical problems.

Recently, a multi-slice imaging technique for rapidly imaging magnetic resonance (MR) signals has been introduced. According to the multi-slicing imaging technique, MR signals of a plurality of slices of an object in one repetition time (TR) section are obtained and the obtained signals are separated from images which correspond to each position and then reconstructed. After the MR signals are obtained, an MRI apparatus may receive the MR signals generated at a plurality of positions of an object in a superposed form. Accordingly, when a final MR image is reconstructed, defects and noise may be generated due to the superposed MR signals.

SUMMARY

One or more exemplary embodiments include a method and apparatus for generating a magnetic resonance (MR) image that has an improved image quality by restricting generation of defects and noise caused by superposed MR signals via an application of a multi-slicing imaging technique.

Additional aspects will be set forth in part in the description which follows and, in part, will be apparent from the description, or may be learned by practice of the presented exemplary embodiments.

According to one or more exemplary embodiments, a magnetic resonance imaging apparatus includes a gradient magnetic field controller configured to apply a spatial encoding gradient to a plurality of slices and to apply a gradient magnetic field in a first direction to the plurality of slices, a radio frequency (RF) receiver configured to receive, for each of the plurality of slices, a respective magnetic resonance signal which is undersampled in a second direction which is different from the first direction, and an image processor configured to generate, based on the respective magnetic resonance signal of each of the plurality of slices, a respective magnetic resonance image of the corresponding one of the plurality of slices.

The spatial encoding gradient may include a frequency encoding gradient defined as a magnetic field component which includes a gradient with respect to a frequency direction, a phase encoding gradient defined as a magnetic field component which includes a gradient with respect to a phase direction, and a slice selection gradient defined as a magnetic field component which includes a gradient with respect to a slice direction.

The first direction may be a slice direction and the second direction may be a phase direction which is different from the first direction.

The gradient magnetic field controller may be further configured to apply a gradient magnetic field in the first direction to the plurality of slices while the frequency encoding gradient is applied to the plurality of slices.

The RF receiver may be further configured to receive each respective magnetic resonance signal in a superposed state in one repetition time section.

Each respective magnetic resonance signal may include shifted position information in the frequency direction as a result of the gradient magnetic field in the first direction being applied to the plurality of slices.

The image processor may be further configured to interpolate a non-measured magnetic resonance signal by using at least one from among a parallel imaging technique and a multi-slice imaging technique.

According to one or more exemplary embodiments, a magnetic resonance imaging apparatus includes a gradient magnetic field controller configured to apply a spatial encoding gradient to each of a first slice and a second slice and to apply a slice selection gradient to each of the first slice and the second slice, a radio frequency (RF) receiver configured to receive a first magnetic resonance signal which relates to the first slice and which includes shifted position information in a frequency direction as a result of the slice selection gradient being applied to the first slice and undersampled in a phase direction, and to receive a second magnetic resonance signal which relates to the second slice and which includes shifted position information in the frequency direction as a result of the slice selection gradient being applied to the second slice and undersampled in the phase direction, and an image processor configured to generate a respective magnetic resonance image of each of the first and second slices based on the received first and second magnetic resonance signals.

The RF receiver may be further configured to receive the first and second magnetic resonance signals in a superposed state in one repetition time.

The image processor may be further configured to separate the first and second magnetic resonance signals in the superposed state, based on a difference in coil sensitivity information between the first slice and the second slice.

According to one or more exemplary embodiments, a method for generating a magnetic resonance image includes applying a spatial encoding gradient to a plurality of slices and a gradient magnetic field in a first direction to the plurality of slices, receiving, for each of the plurality of slices, a respective magnetic resonance signal which is undersampled in a second direction which is different from the first direction, and generating, based on the received respective magnetic resonance signal of each of the plurality of slices, a respective magnetic resonance image of the corresponding one of the plurality of slices.

The spatial encoding gradient may include a frequency encoding gradient defined as a magnetic field component which includes a gradient with respect to a frequency direction, a phase encoding gradient defined as a magnetic field component which includes a gradient with respect to a phase direction, and a slice selection gradient defined as a magnetic field component which includes a gradient with respect to a slice direction.

The first direction may be a slice direction and the second direction is a phase direction which is different from the first direction.

The applying the gradient magnetic field in the first direction may comprise applying the gradient magnetic field in the first direction to the plurality of slices while the frequency encoding gradient is applied to the plurality of slices.

The receiving each respective magnetic resonance signal may comprise receiving each respective magnetic resonance signal in a superposed state in one repetition time section.

Each respective magnetic resonance signal may include shifted position information in the frequency direction as a result of the applying the gradient magnetic field in the first direction to the plurality of slices.

The generating the respective magnetic resonance image of each corresponding one of the plurality of slices may include interpolating a non-measured magnetic resonance signal by using a parallel imaging technique, and generating the respective magnetic resonance image of each corresponding one of the plurality of slices by using a multi-slice imaging technique.

According to one or more exemplary embodiments, a method for generating a magnetic resonance image includes applying a spatial encoding gradient to each of a first slice and a second slice, applying a slice selection gradient defined as a magnetic field component which includes a gradient with respect to a slice direction to each of the first slice and the second slice, receiving a first magnetic resonance signal which relates to the first slice and which includes shifted position information in a frequency direction as a result of the applying the slice selection gradient to the first slice and being undersampled in a phase direction and receiving a second magnetic resonance signal which relates to the second slice and which includes shifted position information in the frequency direction as a result of the applying the slice selection gradient to the second slice and being undersampled in the phase direction, and generating a respective magnetic resonance image of each of the first and second slices based on the received first and second magnetic resonance signals.

The receiving the first and second magnetic resonance signals may include receiving the first and second magnetic resonance signals in a superposed state in one repetition time.

The generating the respective magnetic resonance image of each of the first and second slices may include separating the first and second magnetic resonance signals in the superposed state, based on a difference in coil sensitivity information between the first slice and the second slice, and generating the respective magnetic resonance image of each of the first and second slices based on the separated first and second magnetic resonance signals.

According to one or more exemplary embodiments, there is provided a non-transitory computer readable storage medium having stored thereon a program, which when executed by a computer, performs the method for generating a magnetic resonance image which includes applying a spatial encoding gradient to each of a first slice and a second slice, applying a slice selection gradient defined as a magnetic field component which includes a gradient with respect to a slice direction to the each of the first slice and the second slice, receiving a first magnetic resonance signal which relates to the first slice and which includes shifted position information in a frequency direction as a result of the applying the slice selection gradient to the first slice and being undersampled in a phase direction and receiving a second magnetic resonance signal which relates to the second slice and which includes shifted position information in the frequency direction as a result of the applying the slice selection gradient to the second slice and being undersampled in the phase direction, and generating a respective magnetic resonance image of each of the first and second slices based on the received first and second magnetic resonance signals.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
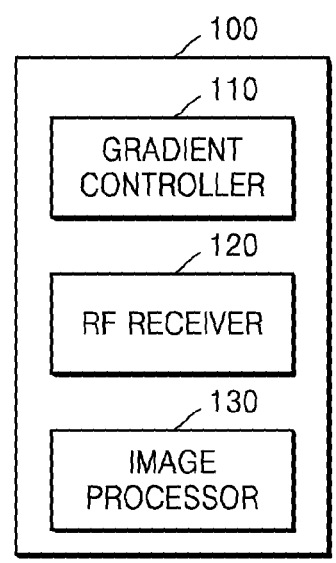
FIG. 1 is a block diagram of an MRI apparatus, according to an exemplary embodiment.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present disclosure. As used herein, the term "and/or" includes any and all combinations of one or more of the associated listed items. Expressions such as "at least one of," when preceding a list of elements, modify the entire list of elements and do not modify the individual elements of the list.

Advantages and features of one or more exemplary embodiments of the present inventive concept and methods of accomplishing the same may be understood more readily by reference to the following detailed description of the exemplary embodiments and the accompanying drawings. In this regard, the present exemplary embodiments may have different forms and should not be construed as being limited to the descriptions set forth herein. Rather, these exemplary embodiments are provided so that this disclosure will be thorough and complete and will fully convey the concept of the present exemplary embodiments to one of ordinary skill in the art, and the present inventive concept will only be defined by the appended claims.

Terms used herein will now be briefly described and then one or more exemplary embodiments of the present inventive concept will be described in detail.

All terms including descriptive or technical terms which are used herein should be construed as having meanings that are apparent to one of ordinary skill in the art. However, the terms may have different meanings according to the intention of one of ordinary skill in the art, precedent cases, or the appearance of new technologies. In addition, some terms may be arbitrarily selected by the applicant, and in this case, the meaning of the selected terms will be described in detail in the detailed description of the inventive concept. Thus, the terms used herein have to be defined based on the meaning of the terms together with the description throughout the specification.

When a part "includes" or "comprises" an element, unless there is a particular description contrary thereto, the part can further include other elements, not excluding the other elements. Further, the term "unit" as used herein with respect to the exemplary embodiments of the present inventive concept refers to a software component or hardware component such as a field-programmable gate array (FPGA) or an application-specific integrated circuit (ASIC), and performs a specific function. However, the term "unit" is not limited to software or hardware. The "unit" may be formed so as to be in an addressable storage medium, or may be formed so as to operate one or more processors. Thus, for example, the term "unit" may refer to any one or more of components such as software components, object-oriented software components, class components, and task components, and may include processes, functions, attributes, procedures, subroutines, segments of program code, drivers, firmware, micro codes, circuits, data, a database, data structures, tables, arrays, or variables. A function provided by the components and "units" may be associated with the smaller number of components and "units", or may be divided into additional components and "units".

Reference will now be made in detail to exemplary embodiments, examples of which are illustrated in the accompanying drawings. In the following description, well-known functions or constructions are not described in detail so as not to obscure the exemplary embodiments with unnecessary detail.

In the present specification, an "image" may refer to multi-dimensional data composed of discrete image elements (e.g., pixels in a two-dimensional (2D) image and voxels in a three-dimensional (3D) image). For example, the image may be a medical image of an object captured by an X-ray apparatus, a computed tomography (CT) apparatus, a magnetic resonance imaging (MRI) apparatus, an ultrasound diagnosis apparatus, or another medical imaging apparatus.

Furthermore, in the present specification, an "object" may include any of a human, an animal, or a part of a human or animal. For example, the object may be an organ (e.g., the liver, the heart, the womb, the brain, a breast, or the abdomen), a blood vessel, or a combination thereof. Furthermore, the "object" may be a phantom. The phantom means a material having a density, an effective atomic number, and a volume approximately the same as those of an organism. For example, the phantom may be a spherical phantom having properties similar to the human body.

Furthermore, in the present specification, a "user" may be, but is not limited to, a medical expert, such as a medic, a nurse, a medical laboratory technologist, or a technician who repairs medical apparatuses.

Furthermore, in the present specification, an "MR image" refers to an image of an object obtained by using the nuclear magnetic resonance principle.

Furthermore, in the present specification, a "pulse sequence" refers to continuous signals repeatedly applied by an MRI apparatus. The pulse sequence may include a time parameter of a radio frequency (RF) pulse, for example, a repetition time (TR) or an echo time (TE).

Furthermore, in the present specification, a "pulse sequence schematic diagram" shows an order of events that occur in an MRI apparatus. For example, the pulse sequence schematic diagram may include any of a diagram showing an RF pulse, a gradient magnetic field, an MR signal, or the like according to time.

Further, in the present specification, a "TR" may signify a repetition time of an RF pulse. For example, a "TR" may signify a time between a time point when a first RF pulse is transmitted and a time point when a second RF signal is transmitted.

Still further, in the present specification, "spatial encoding" may signify obtaining position information according to an axis (direction) of a gradient magnetic field by applying a linear gradient magnetic field that generates additional dephasing of a proton spindle in addition to dephasing of a proton spindle due to an RF signal.

An MRI system is an apparatus which is configured for acquiring a sectional image of a part of an object by expressing, in a contrast comparison, intensity of a MR signal with respect to a radio frequency (RF) signal generated in a magnetic field having a specific strength. For example, if an RF signal that only resonates a specific atomic nucleus (for example, a hydrogen atomic nucleus) is emitted for an instant toward the object which has been placed in a strong magnetic field and then such emission stops, an MR signal is emitted from the specific atomic nucleus, and thus the MRI system may receive the MR signal and acquire an MR image. The MR signal denotes an RF signal emitted from the object. An intensity of the MR signal may be determined based on any one or more of a density of a predetermined atom, for example, hydrogen, of the object, a relaxation time T1, a relaxation time T2, and a flow of blood or the like.

MRI systems include characteristics which are different from those of other imaging apparatuses. Unlike imaging apparatuses such as CT apparatuses that acquire images according to a direction of detection hardware, MRI systems may acquire 2D images or 3D volume images that are oriented toward an optional point. MRI systems do not expose objects or examiners to radiation, unlike CT apparatuses, X-ray apparatuses, position emission tomography (PET) apparatuses, and single photon emission CT (SPECT) apparatuses; MRI systems may acquire images having high soft tissue contrast; and MRI systems may acquire neurological images, intravascular images, musculoskeletal images, and oncologic images that are required to precisely capturing abnormal tissues.

FIG. 1 is a block diagram of an MRI apparatus 100, according to an exemplary embodiment.

Referring to FIG. 1, the MRI apparatus 100 may include at least one of a gradient magnetic field controller 110, an RF receiver 120, and an image processor 130.

The gradient magnetic field controller 110 according to the present exemplary embodiment may be configured to control a gradient coil to generate a spatial encoding gradient. The gradient coil may include X, Y, and Z coils that respectively generate gradient magnetic fields in directions along an X-axis, Y-axis, and Z-axis, which are mutually perpendicular to one another. Further, the spatial encoding gradient may include gradient magnetic fields in the directions along the X-axis, Y-axis, and Z-axis.

The spatial encoding gradient that is applied to an object may provide position information of each part by inducing resonance frequencies of the respective parts of the object to be different from one another. Accordingly, as the spatial encoding gradient is applied to the object, MR signals of the object received via the RF receiver 120 may include position information that may be represented by a 3D coordinate system. Alternatively, the gradient magnetic fields in the directions along an X-axis, a Y-axis, and a Z-axis may correspond to a frequency encoding gradient defined as a magnetic field component which includes a gradient with respect to a frequency direction, for example, the X-axis, a phase encoding gradient defined as a magnetic field component which includes a gradient with respect to a phase direction, for example, the Y-axis, and a slice selection gradient defined as a magnetic field component which includes a gradient with respect to a slice direction, for example, the Z-axis, respectively.

Further, the gradient magnetic field controller 110 may be configured to control a gradient coil to additionally generate a gradient magnetic field in a first direction. The first direction may be a direction in which one gradient of the spatial encoding gradient is applied. For example, the first direction may be a slice direction, for example, a Z-axis direction. In this case, the gradient magnetic field controller 110 may additionally apply a slice selection gradient of the spatial encoding gradient while a frequency encoding gradient is applied to the object. For example, the slice selection gradient additionally applied to the object may have the same signal amplitude and application timing as those of the frequency encoding gradient of the spatial encoding gradient.

The gradient magnetic field controller 110 may be further configured to change the position information included in the MR signal of the object by additionally applying the slice selection gradient to the object. For example, an MR signal of the object may include shifted position information in the frequency direction, for example, the X-axis direction. In addition, a degree of the shift in the position information may vary according to a position on the object where the MR signal is received. In the following description, the gradient magnetic field in the first direction which is additionally applied to the object may be referred to as the "additional gradient".

The gradient magnetic field controller 110 according to the present exemplary embodiment may generate pulse sequence information in order to apply the spatial encoding gradient and the additional gradient to a plurality of slices. A slice may be a unit area on an object from which an MR signal is obtained in order to generate one MR image.

Further, applying a gradient magnetic field to a plurality of slices may signify applying a gradient magnetic field to a plurality of slices located at discontinuous positions or continuous positions on an object for one TR. In addition, the pulse sequence information generated by the gradient magnetic field controller 110 may include information about any one or more of the intensity, application duration, or application timing of a pulse signal applied to the gradient coil.

Alternatively, the gradient magnetic field controller 110 may be configured to receive pulse sequence information from an external module (not shown).

The RF receiver 120 may include at least one coil and each coil may be configured to receive an MR signal. For example, a plurality of coils may include RF coils of various channel capacities, such as, for example, 16 channels, 32 channels, 72 channels, and 144 channels.

The RF receiver 120 according to the present exemplary embodiment may be configured to receive MR signals that the slices transmit for one TR. The RF receiver 120 may be configured to receive the MR signals of the respective slices to be superposed with one another. For example, the RF receiver 120 may simultaneously receive the MR signals emitted from the slices by applying RF pulse signals having a plurality of frequency components by using an RF controller (not shown). Alternatively, the fact that the RF receiver 120 simultaneously receives the MR signals may signify that the RF receiver 120 obtains MR signals of the slices in one read-out section.

Further, each slice may include shifted position information in the frequency direction, for example, the X-axis direction, by a different distance.

Still further, the RF receiver 120 may be configured to receive an MR signal which is undersampled in a second direction that is different from the first direction. For example, when the first direction is the slice direction, for example, the Z-axis direction, the second direction may be a phase direction, for example, the Y-axis direction. The RF receiver 120 may receive the MR signal which is undersampled in the phase direction based on the phase encoding gradient controlled by the gradient magnetic field controller 110.

Alternatively, the RF receiver 120 may be configured to receive an MR signal from the object to which a spiral pulse sequence having a spiral trajectory in a k-space is applied by an RF controller (not shown). In this case, the RF receiver 120 may be configured to receive an MR signal undersampled in a spiral direction as the spiral pulse sequence is applied to the object.

The RF receiver 120 according to the present exemplary embodiment may be configured to provide a received MR signal to the image processor 130. Accordingly, the MR signal provided to the image processor 130 may be a signal that is obtained as the MR signals of the respective slices are superposed with one another and that is undersampled in the second direction.

The image processor 130 may be configured to generate an MR image by processing an MR signal received from the RF receiver 120. The image processor 130 may be further configured to perform various processing functions, such as amplification, frequency conversion, phase detection, low frequency amplification, or filtering, on the MR signal received from the RF receiver 120.

The image processor 130 may be further configured, for example, to arrange digital data in a k-space of a memory, for example, referred to as a Fourier space or a frequency space, and to perform a 2D or 3D Fourier transform on the digital data, thereby generating an image. Alternatively, the k-space may be a set of raw data about an MR signal. The k-space may include position information and contrast information of an MR signal.

The image processor 130 according to the present exemplary embodiment may be configured to generate an MR signal of each of the slices based on the MR signals of the slices.

Further, the image processor 130 may be configured to receive a result of undersampling of the MR signals of the slices in the second direction. According to the result of undersampling in the second direction, some rows of the k-space, for example, a Ky row of the k-space, may be empty without being arranged with data. The image processor 130 may be further configured to interpolate a non-measured signal by using a parallel imaging technique. The parallel imaging technique may include, for example, a sense (sensitivity encoding) method or a generalized autocalibrating partially parallel acquisitions (GRAPPA) method.

The image processor 130 may be configured to calculate a spatial correlation coefficient or a convolution kernel coefficient that is a spatial interaction value between a calibration signal and a measured source signal adjacent to the calibration signal via self-calibration, by using, for example, the GRAPPA technique, and to estimate a non-measured signal by using a calculated spatial correlation or convolution kernel coefficient. In detail, according to the GRAPPA technique, unacquired lines of a k-space may be reconstructed by channels by using a received MR signal and additional autocalibrating lines (ACS line).

In addition, the image processor 130 may obtain a k-space in a state in which MR signals of the respective slices are superposed with one another. The MR signal of each slice may include respective shifted position information in the frequency direction, for example, the X-axis direction, by a respective distance that varies from slice to slice.

The image processor 130 may be configured to separate the MR signals of the slices into an MR signal of each slice. The image processor 130 may be further configured to separate MR signals of the slices and to generate an MR image of each slice by using a multi-slice imaging technique. A multi-slice imaging technique may include, for example, a slice-GRAPPA method or a multi-slice controlled aliasing in parallel imaging results in higher acceleration (MS-CAIPIRINHA) method.

The image processor 130 may be further configured to separate the MR signals of the slices received in a superposed state into an MR signal of each slice, for example, by using a difference in coil sensitivity information between the slices according to the multi-slice imaging technique.

In general, when the MR signals of the slices are separated by the multi-slice imaging technique, defects and noise may be generated. This is because, to the extent that the superposed MR signals of the slices include similar position information, for example, the frequency direction, that is, the X-axis direction, and the phase direction, that is, the Y-axis direction are similar to each other, except for the slice direction, that is, the Z-axis direction, a difference in the coil sensitivity information between the slices is negligible.

Since the MRI apparatus 100 according to the present exemplary embodiment acquires shifted position information which corresponds to each of the slices by the additional gradient, in the frequency direction, for example, the X-axis direction, by a difference distance, the difference in the coil sensitivity information between the slices may be increased. Accordingly, the image processor 130 may generate an MR image having a little defect and noise.

Further, as described above, since the MRI apparatus 100 performs parallel imaging based on the result of undersampling in the second direction, which is different from the first direction, a scan time may be reduced. In addition, since the undersampled MR signal is aliased in the phase direction, which is different from the frequency direction, the difference in the coil sensitivity information between the slices is not reduced.

As such, the MRI apparatus 100 may provide a user with an MR image that has an improved signal-to-noise ratio (SNR) while reducing a scan time.

Figure 2:
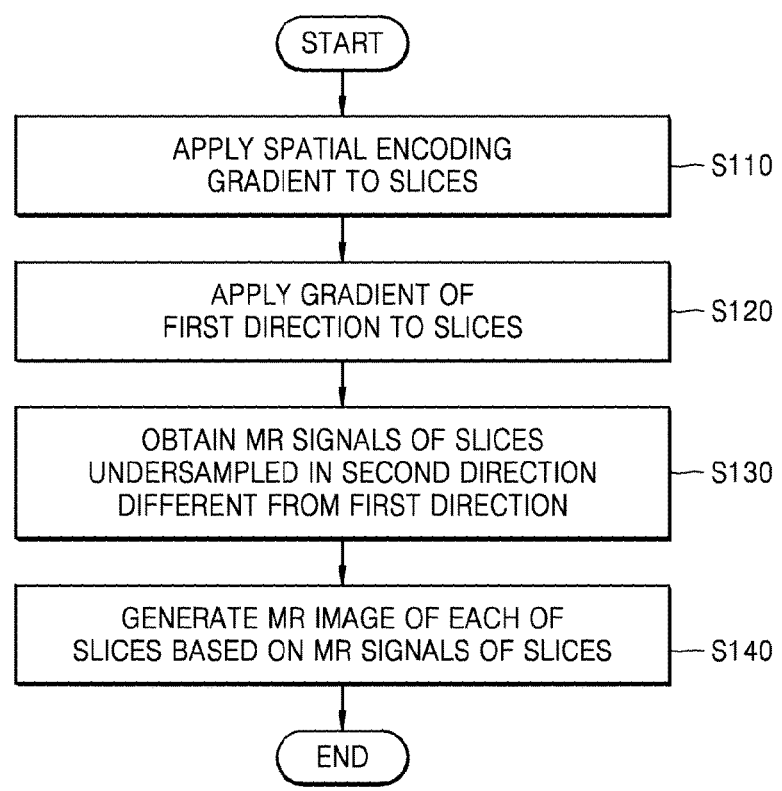
FIG. 2 is a flowchart of a method for generating an MR image, according to an exemplary embodiment.

FIG. 2 is a flowchart of a method for generating an MR image, according to an exemplary embodiment.

Referring to FIG. 2, in operation S110, the MRI apparatus 100 according to the present exemplary embodiment may apply a spatial encoding gradient to a plurality of slices. A slice may be a unit area on an object from which an MR signal is obtained in order to generate one MR image. Further, applying a gradient magnetic field to a plurality of slices may signify applying a gradient magnetic field to a plurality of slices located at discontinuous positions or continuous positions on an object for one TR.

As the spatial encoding gradient is applied to the object, resonance frequencies for the respective parts of the object are induced to be different from one another, and thus position information of the parts may be provided. Accordingly, MR signals of the object may include position information that may be represented by a 3D coordinate system. The slices may be selected from the same or similar tissues on the object. In this case, when the spatial encoding gradient is applied to the slices, each slice may emit an MR signal including the same or similar pieces of position information, in which the frequency direction, that is, the X-axis direction, and the phase direction, that is, the Y-axis direction, are similar to each other, except for the slice direction, that is, the Z-axis direction.

Further, the spatial encoding gradient may include a slice selection gradient, a frequency encoding gradient, and a phase encoding gradient.

In operation S120, the MRI apparatus 100 according to the present exemplary embodiment may additionally apply a gradient magnetic field in a first direction to a plurality of slices. The first direction may be a direction in which one gradient of the spatial encoding gradient is applied. For example, the first direction may be the slice direction, for example, the Z-axis direction. In this case, the MRI apparatus 100 may additionally apply the slice selection gradient to the slices while the frequency encoding gradient of the spatial encoding gradient is applied to the slices. For example, the slice selection gradient that is additionally applied to the object may have the same application timing as that of the frequency encoding gradient of the spatial encoding gradient. In the following description, the gradient magnetic field in the first direction may be referred to as the "additional gradient".

In some exemplary embodiments, the MRI apparatus 100 may change position information included in an MR signal emitted from each of the slices by applying the additional gradient to the slices. For example, the MR signal of each slice may include shifted position information in the frequency direction, for example, the X-axis direction. Further, a degree of the shift in the position information may vary according to the position of each slice on the object. Accordingly, when the spatial encoding gradient and the additional gradient are applied to the slices, each slice may emit an MR signal which includes the shifted position information in the frequency direction, for example, the X-axis direction, by a different distance. Even when the slices are selected from the same tissue, the position information included in the MR signal of each slice may vary according to the application of the additional gradient.

In operation S130, the MRI apparatus 100 may receive MR signals of the slices which are undersampled in the second direction, which is different from the first direction. For example, when the first direction is a slice direction, the second direction may be a phase direction. In this case, the MRI apparatus 100 may receive an undersampled MR signal in the phase direction.

Alternatively, the MRI apparatus 100 may receive an MR signal from the object to which a spiral pulse sequence having a spiral trajectory in a k-space has been applied. In this case, the MRI apparatus 100 may receive an MR signal which is undersampled in a spiral direction as the spiral pulse sequence is applied to the object.

Further, the MRI apparatus 100 may receive the MR signals emitted from the slices in a superposed state. For example, the MRI apparatus 100 that simultaneously applies an RF signal to the slices may simultaneously receive the MR signal emitted from the slices. Alternatively, the MRI apparatus 100 simultaneously receiving MR signals may signify that the MRI apparatus 100 obtains MR signals of the slices in one read-out section.

In operation S140, the MRI apparatus 100 may generate a respective MR image of each of the slices based on the MR signals of the slices.

The MRI apparatus 100 may receive a result of the undersampling of the MR signals of the slices in the second direction. According to the result of undersampling in the second direction, some rows of the k-space, for example, a Ky row of the k-space, may be empty without being arranged with data. The MRI apparatus 100 may interpolate a non-measured signal by using the parallel imaging technique. The parallel imaging technique may include, for example, a sense (sensitivity encoding) method or a generalized autocalibrating partially parallel acquisitions (GRAPPA) method.

Further, the MRI apparatus 100 may obtain a k-space in a state in which MR signals of the respective slices are superposed with one another. The MR signal of each slice may include shifted position information in the frequency direction, for example, the X-axis direction, which refers to a respective shift for which a distance varies from slice to slice.

The MRI apparatus 100 may separate the MR signals of the slices into an MR signal of each slice. The MRI apparatus 100 may separate the MR signals of the slices and generate a respective MR image of each slice by using a multi-slice imaging technique. A multi-slice imaging technique may include, for example, a slice-GRAPPA method or a multi-slice controlled aliasing in parallel imaging results in higher acceleration (MS-CAIPIRINHA) method.

The MRI apparatus 100 may separate the MR signals of the slices received in a superposed state into an MR signal of each slice, for example, by using a difference in the coil sensitivity information between the slices according to the multi-slice imaging technique.

As such, in the MRI apparatus 100 according to the present exemplary embodiment, since MR signals emitted from the slices selected from the same tissue may include different pieces of position information, a respective MR image of each slice which has an improved SNR may be generated.

Figure 3:
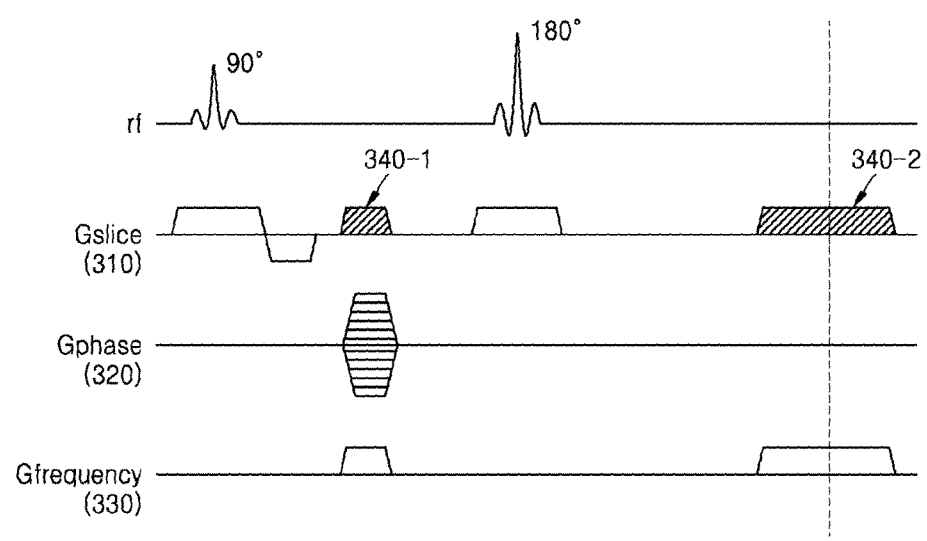
FIG. 3 is an example of a spin echo sequence diagram which includes an additional gradient magnetic field.

FIG. 3 is an example of a spin echo sequence diagram which includes an additional gradient.

Referring to FIG. 3, the MRI apparatus 100 applies a spatial encoding gradient and an additional gradient to an object based on a spin echo technique. The spin echo technique may be a technique which includes imaging a signal generated by applying a 90° RF pulse to the object and then applying a 180° RF pulse that is a refocusing pulse. Further, the spatial encoding gradient may include a slice selection gradient (i.e., "Gslice") 310, a phase encoding gradient (i.e., "Gphase") 320, and a frequency encoding gradient (i.e., "Gfrequency") 330.

The MRI apparatus 100 according to the present exemplary embodiment may apply an RF signal to the object and then apply additional gradients 340-1 and 340-2 while the frequency encoding gradient 330 is being applied to the object.

Alternatively, the MRI apparatus 100 may receive MR signals from the slices for each TR by applying an RF pulse signal which includes a plurality of frequency components to the object.

Figure 4:
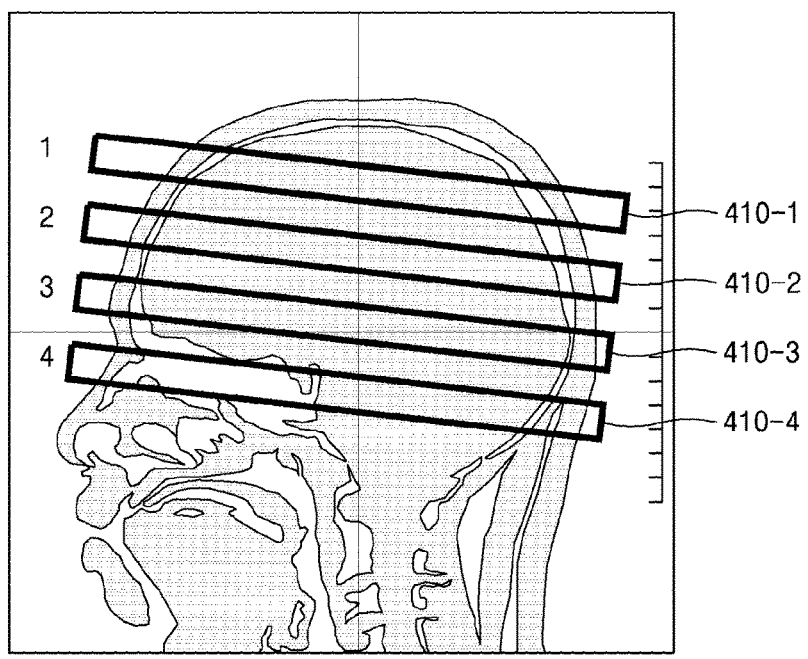
FIG. 4 illustrates an example of selecting a plurality of slices from brain tissue of an object via an MRI apparatus.

FIG. 4 illustrates an example of selecting a plurality of slices from brain tissue of an object by using the MRI apparatus 100. As illustrated in FIG. 4, the MRI apparatus 100 may select first slice 410-1, second slice 410-2, third slice 410-3, and 410-4 from brain tissue of an object.

Figure 5A:
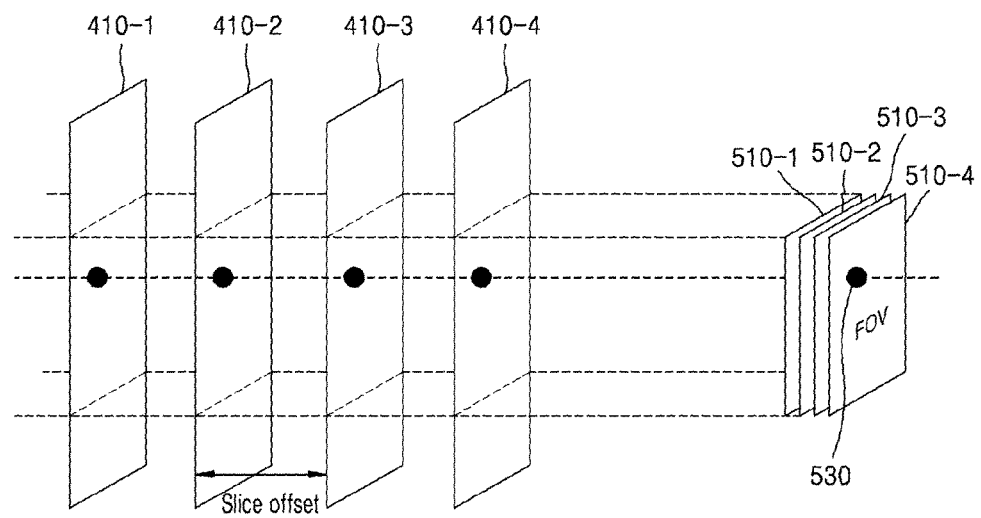
FIG. 5A illustrates an example of MR signals received from a plurality of slices.
Figure 5B:
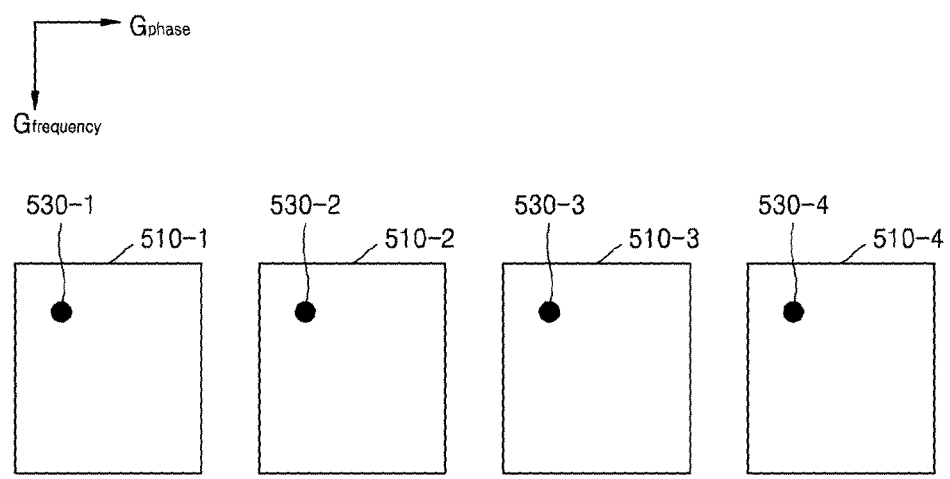
FIG. 5B illustrates an MR signal received from each of the slices.

FIG. 5A illustrates an example of MR signals received from the slices 410-1, 410-2, 410-3, and 410-4. FIG. 5B illustrates an MR signal received from each of the slices 410-1, 410-2, 410-3, and 410-4.

Referring to FIG. 5A, the MRI apparatus 100 may determine fields of view (FOVs) 510-1, 510-2, 510-3, and 510-4 with respect to the slices 410-1, 410-2, 410-3, and 410-4, based on an inclination for applying a spatial encoding gradient. An FOV is an area of the object that is photographed by the MRI apparatus 100 and may be determined by the spatial encoding gradient. Further, position information included in an MR signal emitted from the object may correspond to a 2D coordinate system, for example, the frequency direction (Gfrequency) and the phase direction (Gphase) except for the slice direction (Gslice) of position information, which is determined by the FOVs 510-1, 510-2, 510-3, and 510-4.

An MR image signal received from particular positions of the slices 410-1, 410-2, 410-3, and 410-4 may include the same or similar pieces of position information 530-1, 530-2, 530-3, and 530-4, as illustrated in FIG. 5B. As such, the MRI apparatus 100 may receive MR signals of the slices 410-1, 410-2, 410-3, and 410-4 which include the same or similar pieces of position information, in a superposed state.

Figure 5C:
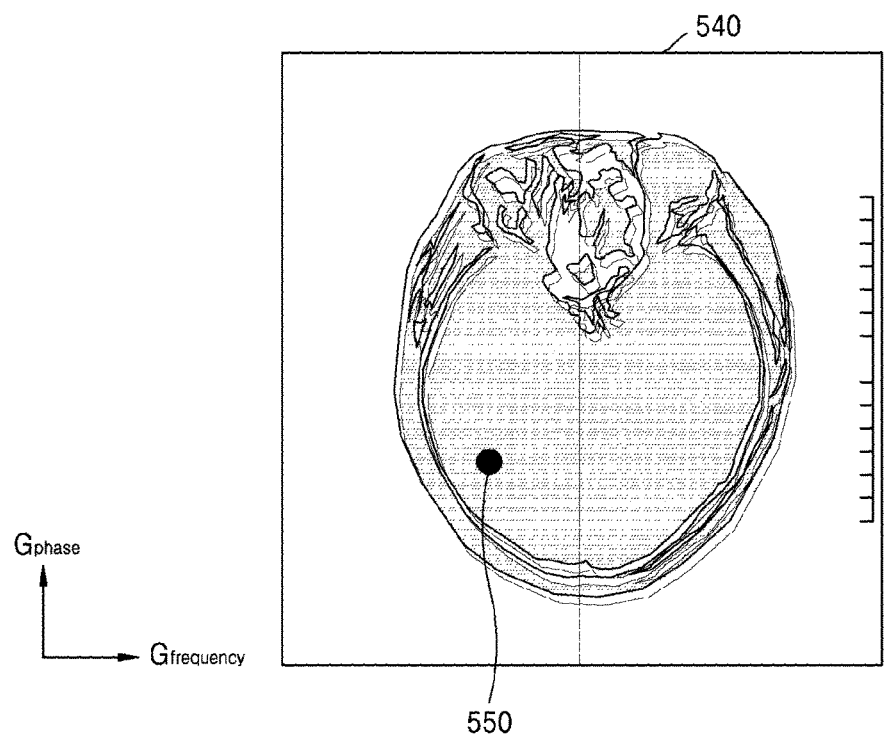
FIG. 5C illustrates an example of imaging the MR signals received from the slices.

FIG. 5C illustrates an example of imaging the MR signals received from the slices 410-1, 410-2, 410-3, and 410-4.

Referring to FIG. 5C, the MRI apparatus 100 may generate a first MR image 540 in the form of MR images of the slices 410-1, 410-2, 410-3, and 410-4 superposed with one another. For example, the MR image signal which includes the same or similar pieces of position information may be imaged at same or similar coordinates 550 on the first MR image 540.

The MRI apparatus 100 may obtain, for example, a difference in the coil sensitivity information between the slices. Further, the MRI apparatus 100 may separate the slices 410-1, 410-2, 410-3, and 410-4 by using the respective differences in the coil sensitivity information between the slices 410-1, 410-2, 410-3, and 410-4 in correspondence to the respective coordinates of the first MR image 540.

The MR signals of the slices 410-1, 410-2, 410-3, and 410-4 that are superposed at the respective coordinates of the first MR image 540 may be signals received from the same coil or similar coils. Accordingly, a difference in the coil sensitivity information between the slices which correspond to the respective coordinates of the first MR image 540 may be negligible. Further, when the difference in the coil sensitivity information between the slices is negligible, an MR image separated for each slice may have a low SNR.

Figure 6A:
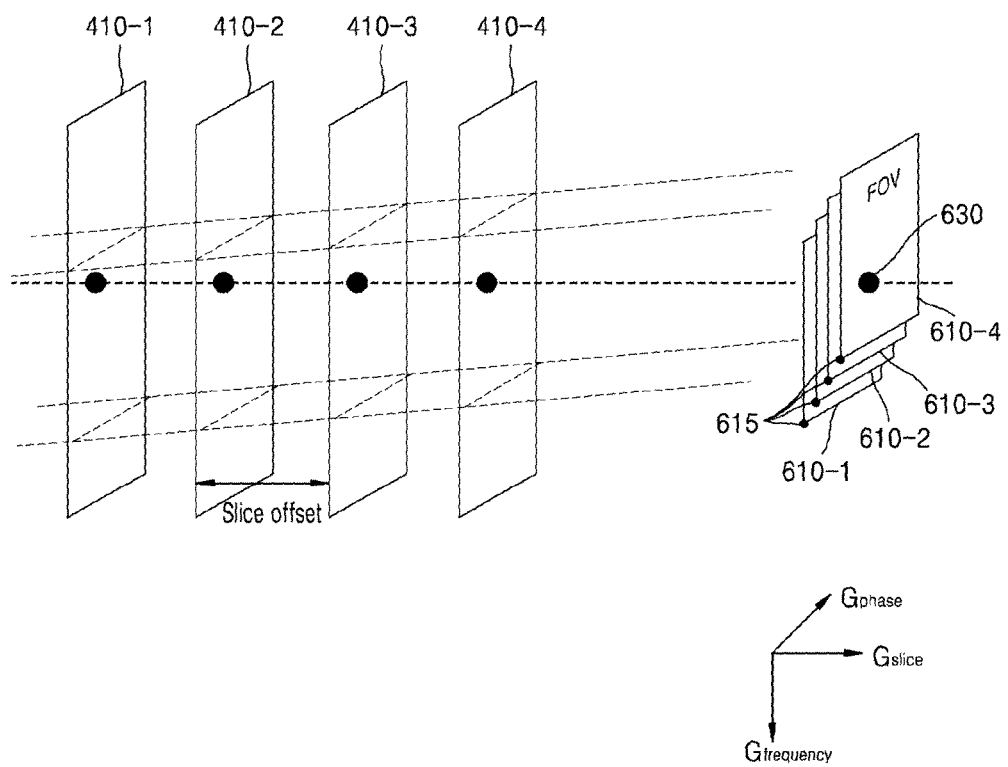
FIG. 6A illustrates an example of MR signals received from a plurality of slices.
Figure 6B:
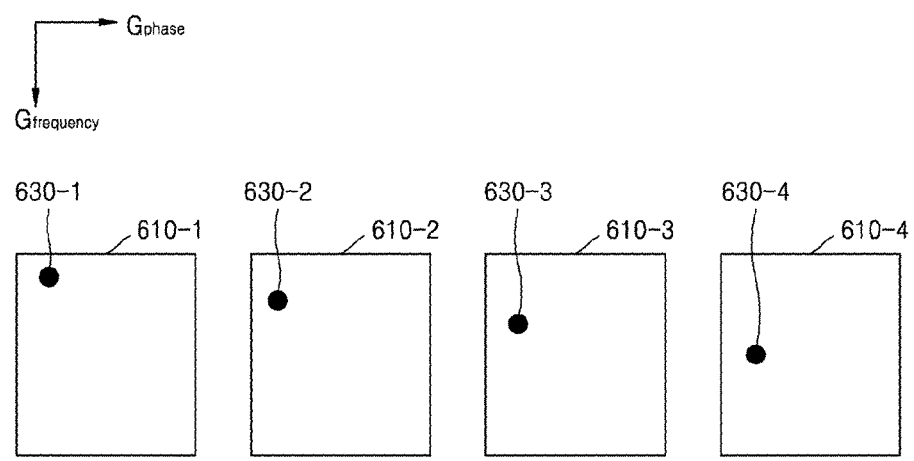
FIG. 6B illustrates an MR signal received from each of the slices.

FIG. 6A illustrates an example of MR signals received from the slices 410-1, 410-2, 410-3, and 410-4. FIG. 6B illustrates an MR signal received from each of the slices 410-1, 410-2, 410-3, and 410-4.

Referring to FIG. 6A, the MRI apparatus 100 may change FOVs 610-1, 610-2, 610-3, and 610-4 with respect to the slices 410-1, 410-2, 410-3, and 410-4 as determined by a spatial encoding gradient, by applying an additional gradient to the slices 410-1, 410-2, 410-3, and 410-4. Accordingly, the MRI apparatus 100 may shift a reference point 615 of a 2D coordinate system, for example, the frequency direction (Gfrequency) and the phase direction (Gphase), which is determined by the FOVs 610-1, 610-2, 610-3, and 610-4. A degree of the shift of the reference point 615 may vary according to each slice. Accordingly, a MR signal of each slice may include shifted position information in the frequency direction, for example, Gfrequency, based on the changed FOVs 610-1, 610-2, 610-3, and 610-4.

For example, an MR image signal 630 received from a particular position of the slices 410-1, 410-2, 410-3, and 410-4 may include different pieces of position information 630-1, 630-2, 630-3, and 630-4, as illustrated in FIG. 6B.

Figure 6C:
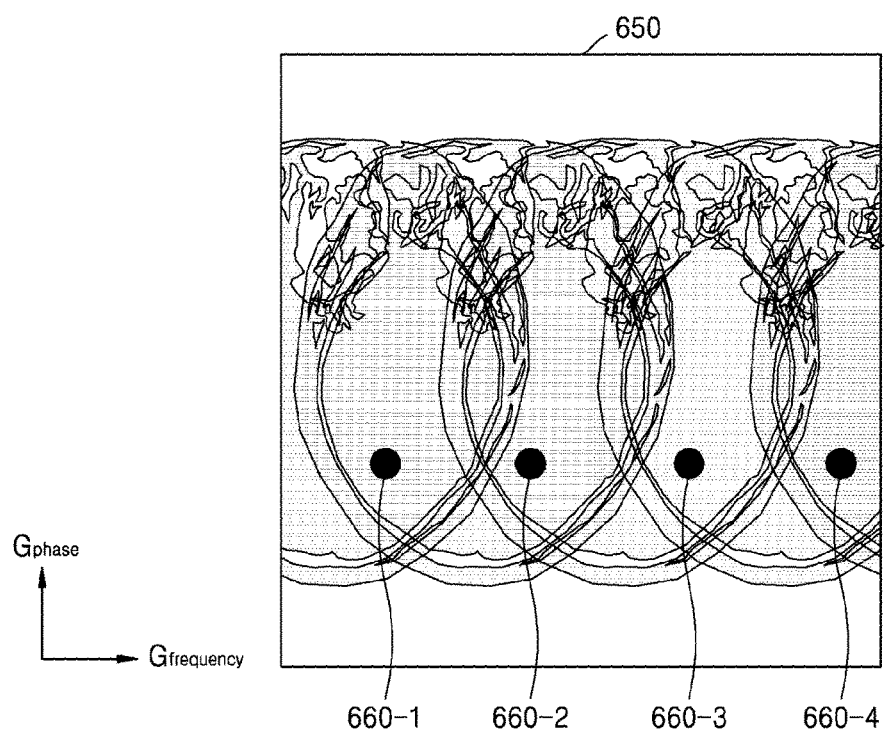
FIG. 6C illustrates an example of imaging the MR signals received from the slices.

FIG. 6C illustrates an example of imaging the MR signals received from the slices 410-1, 410-2, 410-3, and 410-4.

Referring to FIG. 6C, the MRI apparatus 100 may generate a second MR image 650 in the form of respective MR images of the slices 410-1, 410-2, 410-3, and 410-4 being superposed at positions moved in the frequency direction. For example, MR signals 630-1, 630-2, 630-3, and 630-4 which include different pieces of position information may be imaged at different respective coordinates 660-1, 660-2, 660-3, and 660-4 on the second MR image 650.

Accordingly, the MR signals of the slices 410-1, 410-2, 410-3, and 410-4 superposed at the coordinates of the second MR image 650 may be signals received from different coils. Accordingly, differences in the coil sensitivity information between the slices corresponding to the respective coordinates of the second MR image 650 may be different from one another.

Accordingly, the MRI apparatus 100 according to the present exemplary embodiment may generate a respective MR image of each slice that has a high SNR.

Figure 7:
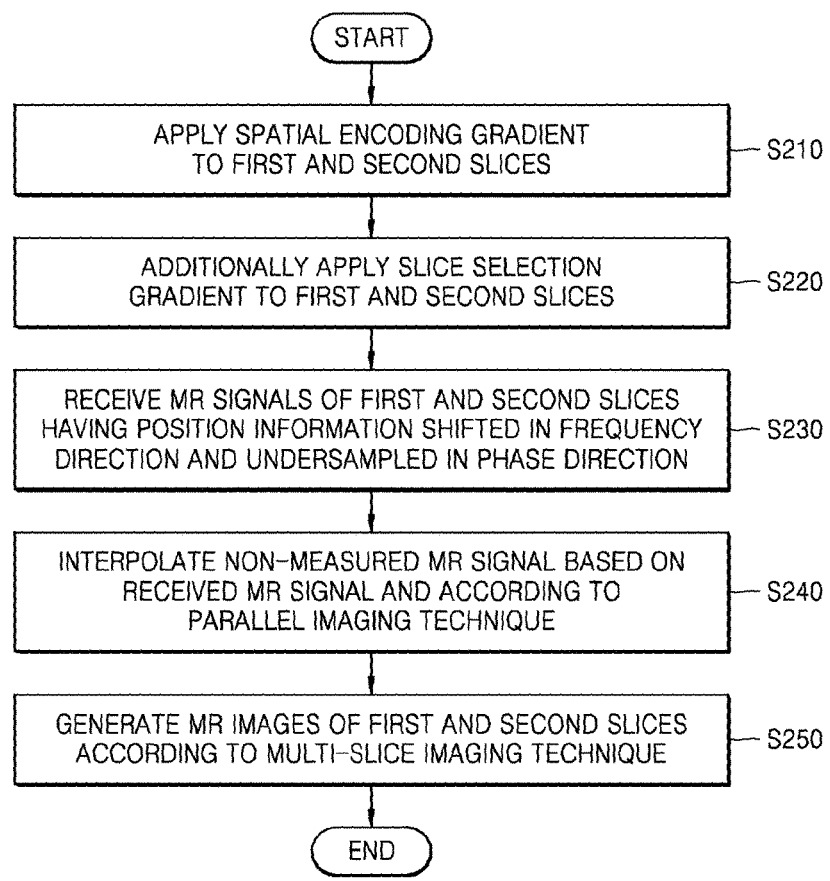
FIG. 7 is a flowchart of a method for generating an MR image via an MRI apparatus, according to an exemplary embodiment.

FIG. 7 is a flowchart of a method for generating an MR image by using the MRI apparatus 100, according to an exemplary embodiment.

Referring to FIG. 7, in operation S210, the MRI apparatus 100 may apply a spatial encoding gradient to each of a first slice and a second slice. Further, in operation S220, the MRI apparatus 100 may additionally apply the slice selection gradient, for example, the Z-axis direction, to each of the first and second slices. As the slice selection gradient is additionally applied to the first and second slices, position information of each slice may indicate a respective shift in the frequency direction.

In operation 230, the MRI apparatus 100 may have shifted position information in the frequency direction and receive MR signals of the first and second slices which are undersampled in the phase direction. The MRI apparatus 100 may acquire a respective MR image signal from each slice which includes shifted position information in the frequency direction by a different respective distance as the FOV is shifted in the frequency direction. Accordingly, the MRI apparatus 100 may receive the MR signals of the first and second slices in a superposed state at a position which is shifted in the frequency direction. For example, the MRI apparatus 100 may simultaneously receive the MR signals of the first and second slices in one TR.

Further, the MRI apparatus 100 may receive an MR signal which is aliased in the phase direction by undersampling.

In operation S240, the MRI apparatus 100 may interpolate a non-measured MR signal according to the parallel imaging technique, based on the received MR signal. The MRI apparatus 100 may calculate a spatial correlation coefficient that is a spatial interaction value between a calibration signal and a measured source signal which is adjacent to the calibration signal via self-calibration, and estimate a non-measured signal by using a calculated spatial correlation coefficient.

In operation S250, the MRI apparatus 100 may generate an MR image of each slice based on an interpolated MR signal, according to the multi-slice imaging technique. The MRI apparatus 100, for example, may separate the MR signals of the slices received in a superposed state into a respective MR signal of each slice, for example, by using the corresponding differences in the coil sensitivity information between the slices.

Further, the MRI apparatus 100 may generate a respective MR image of each slice based on a separate MR signal.

Figure 8:
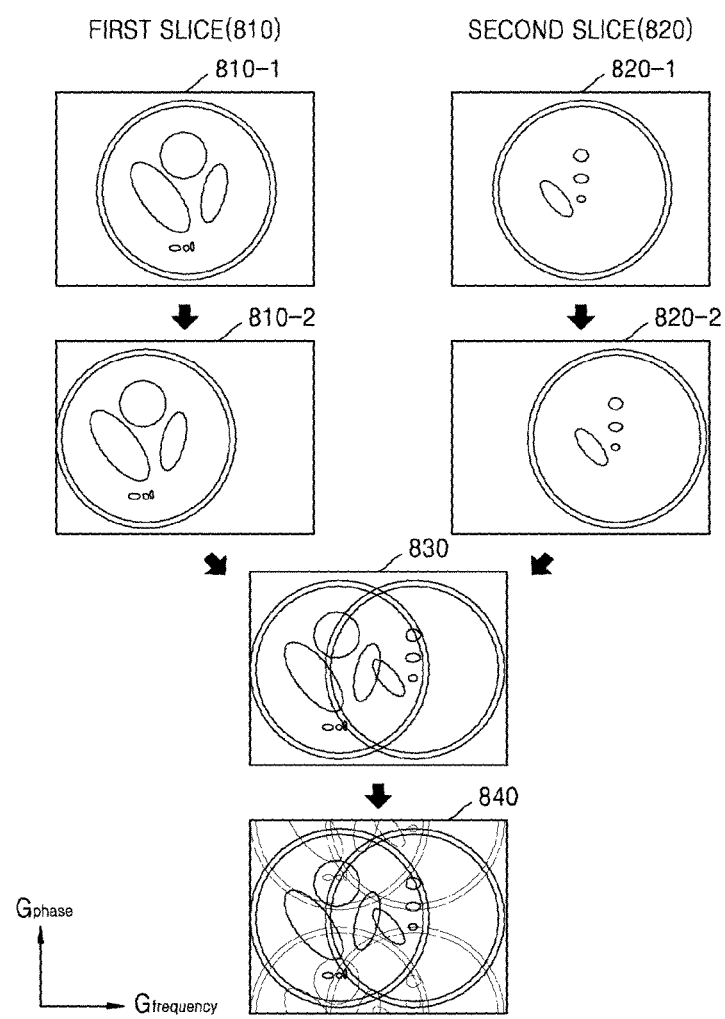
FIG. 8 illustrates an MR signal that an MRI apparatus receives.

FIG. 8 illustrates an MR signal that the MRI apparatus 100 receives.

Referring to FIG. 8, as a spatial encoding gradient is applied to a first slice 810 and a second slice 820, each of MR signals 810-1 and 820-1 of first and second slices 810 and 820 may include position information.

Also, as the slice selection gradient is additionally applied to each of the first and second slices 810 and 820, each of MR signals 810-2 and 820-2 of the first and second slices 810 and 820 may be received via a shifted FOV. Accordingly, each of MR signals 810-2 and 820-2 of the first and second slices 810 and 820 may include shifted position information in the frequency direction.

The MRI apparatus 100 may receive the MR signals 810-2 and 820-2 of the first and second slices 810 and 820 including shifted position information in the frequency direction, in a superposed state 830.

Further, the MRI apparatus 100 may receive an MR signal 840 which is undersampled in the phase direction so as to be aliased in the phase direction. The MRI signal 840 is undersampled in the phase direction and undersampled in the frequency direction. In the example of FIG. 8 item 840, the MRI signal 840 exhibits overlap in the phase direction and overlap in the frequency direction.

Since the MRI apparatus 100 receives the MR signals of the respective slices via different FOVs, the coil sensitivity information between the slices that are superposed with each other may be different from each other. Accordingly, the MRI apparatus 100 may generate an MR image which has an improved SNR while reducing a scan time.

Figure 9:
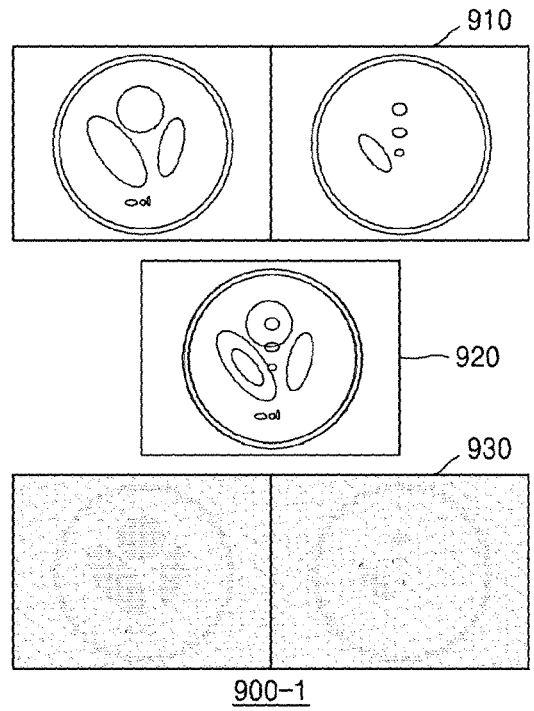
FIG. 9 illustrates an example of generating an MR image of each of the slices via an MRI apparatus.
Figure 9:
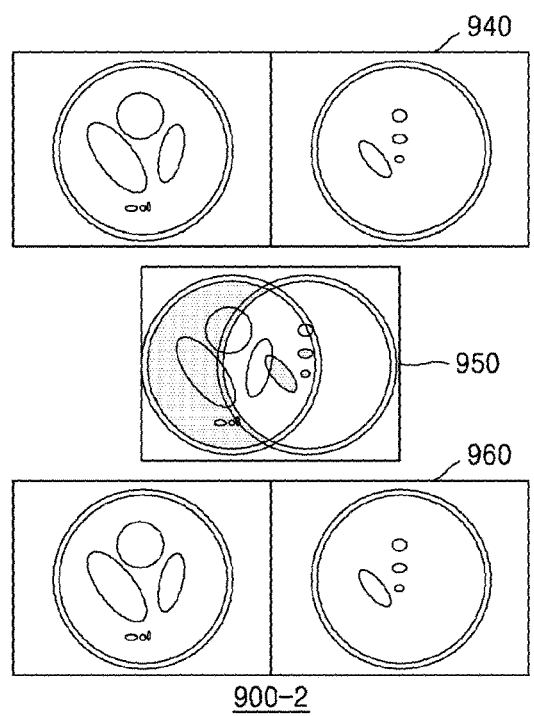

FIG. 9 illustrates an example of generating an MR image of each of the slices by using the MRI apparatus 100.

Referring to an image 900-1 of FIG. 9, the MRI apparatus 100 may receive respective MR signals from each of the slices by generating a pulse sequence which includes an RF pulse that corresponds to a plurality of frequencies and a spatial encoding gradient pulse. The MRI apparatus 100 may separate respective MR signals of slices by using the coil sensitivity information between the slices. When the slices are selected from the same tissue or similar tissues of an object, a difference in the coil sensitivity information between the slices may be negligible. Accordingly, defects and noise may be generated in a generated MR image of each slice.

Referring to an image 900-2 of FIG. 9, the MRI apparatus 100 according to the present exemplary embodiment may generate a pulse sequence so as to additionally include a gradient pulse of a slice direction, in addition to the RF pulse which corresponds to a plurality of frequencies and the spatial encoding gradient pulse. In this case, position information of each slice may be shifted in the frequency direction. Accordingly, even when the slices are selected from the same tissue, the MRI apparatus 100 may generate an MR image that has a high SNR by using the difference in the coil sensitivity information between the slices.

Figure 10:
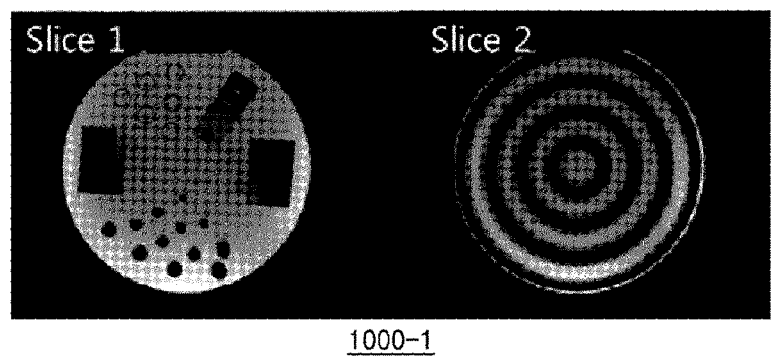
FIG. 10 illustrates an example of generating an MR image by using a resolution phantom via an MRI apparatus.
Figure 10:
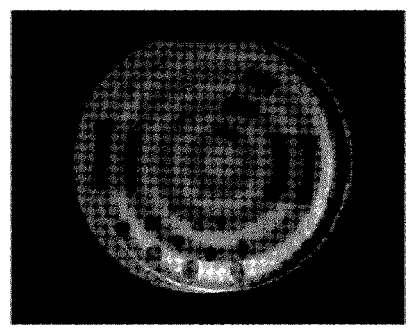
Figure 10:
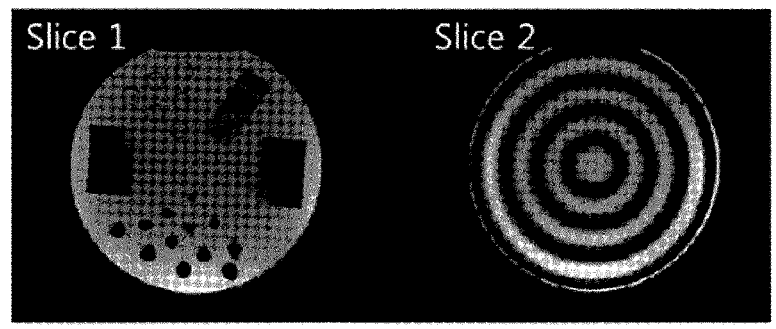

FIG. 10 illustrates an example of generating an MR image by using a resolution phantom by using the MRI apparatus 100.

Referring to FIG. 10, an image 1000-1 shows original images of slices. The MRI apparatus 100 may apply a spatial encoding gradient and a slice selection gradient to each slice and receive a respective MR signal which is undersampled in the phase direction. An image 1000-2 is an image that results after the MRI apparatus 100 interpolates the MR signal which is undersampled in the phase direction. As illustrated in the image 1000-2, images of the respective slices may be shifted in the frequency direction in order to be superposed with each other. Further, an image 1000-3 shows a result of separating the MR signals of the respective slices from the MR image of the image 1000-2 by using the difference in the coil sensitivity information by the MRI apparatus 100.

As such, the MRI apparatus 100 according to the present exemplary embodiment may generate an MR image which has an improved SNR while reducing a scan time.

Figure 11:
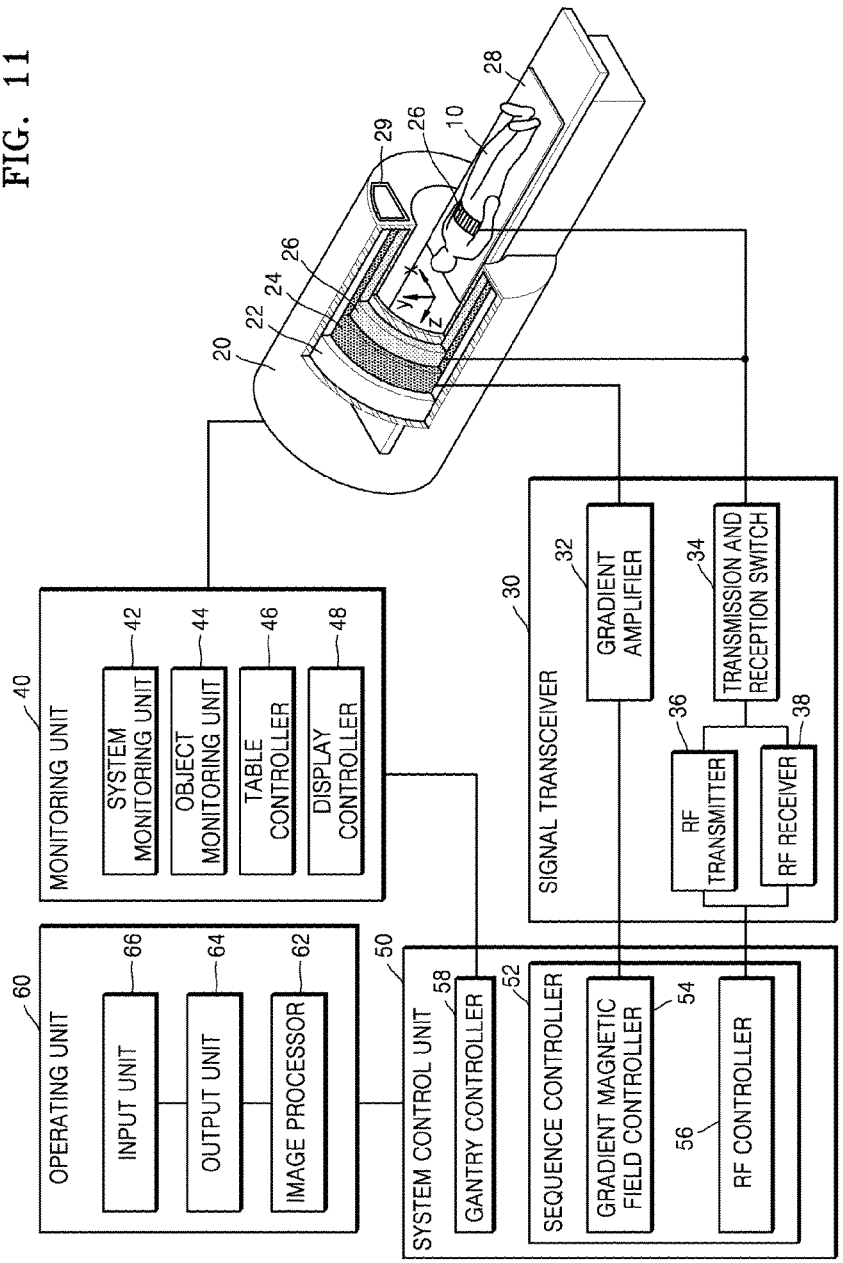
FIG. 11 is a block diagram of an MRI apparatus, according to an exemplary embodiment.

FIG. 11 is a block diagram of the MRI apparatus 100, according to an exemplary embodiment.

Referring to FIG. 11, the MRI apparatus 100 may include a gantry 20, a signal transceiver 30, a monitoring unit (also referred to herein as a "monitor") 40, a system control unit (also referred to herein as a "system controller") 50, and an operating unit (also referred to herein as an "operator") 60.

The gantry 20 prevents external emission of electromagnetic waves generated by a main magnet 22, a gradient coil 24, and an RF coil 26. A magnetostatic field and a gradient magnetic field are formed in a bore in the gantry 20, and an RF signal is emitted toward an object 10.

The main magnet 22, the gradient coil 24, and the RF coil 26 may be arranged in a predetermined direction of the gantry 20. The predetermined direction may be a coaxial cylindrical direction. The object 10 may be disposed on a table 28 that is capable of being inserted into a cylinder along a horizontal axis of the cylinder.

The main magnet 22 generates a magnetostatic field or a static magnetic field for aligning magnetic dipole moments of atomic nuclei of the object 10 in a constant direction. A precise and accurate MR image of the object 10 may be obtained due to a magnetic field generated by the main magnet 22 being strong and uniform.

The gradient coil 24 includes X, Y, and Z coils for generating gradient magnetic fields in X-axis, Y-axis, and Z-axis directions which cross each other at right angles (i.e., which are mutually orthogonal). The gradient coil 24 may provide location information of each region of the object 10 by variably inducing resonance frequencies according to the regions of the object 10.

The RF coil 26 may emit an RF signal toward a patient and receive an MR signal emitted from the patient. In detail, the RF coil 26 may transmit, toward atomic nuclei included in the patient and having precessional motion, an RF signal which has the same frequency as that of the precessional motion, stop transmitting the RF signal, and then receive an MR signal emitted from the atomic nuclei included in the patient.

For example, in order to transit an atomic nucleus from a low energy state to a high energy state, the RF coil 26 may generate and apply an electromagnetic wave signal that is an RF signal which corresponds to a type of the atomic nucleus, to the object 10. When the electromagnetic wave signal generated by the RF coil 26 is applied to the atomic nucleus, the atomic nucleus may transit from the low energy state to the high energy state. Then, when electromagnetic waves generated by the RF coil 26 disappear, the atomic nucleus to which the electromagnetic waves were applied transits from the high energy state to the low energy state, thereby emitting electromagnetic waves having a Larmor frequency. In this aspect, when the applying of the electromagnetic wave signal to the atomic nucleus is ceased, an energy level of the atomic nucleus is changed from a high energy level to a low energy level, and thus the atomic nucleus may emit electromagnetic waves having a Larmor frequency. The RF coil 26 may receive electromagnetic wave signals from atomic nuclei included in the object 10.

The RF coil 26 may be realized as one RF transmitting and receiving coil which has both a function of generating electromagnetic waves, each of which has an RF that corresponds to a type of an atomic nucleus, and a function of receiving electromagnetic waves emitted from an atomic nucleus. Alternatively, the RF coil 26 may be realized as a transmission RF coil which has a function of generating electromagnetic waves, each of which has an RF that corresponds to a type of an atomic nucleus, and a reception RF coil which has a function of receiving electromagnetic waves emitted from an atomic nucleus.

The RF coil 26 may be fixed to the gantry 20 or may be detachable. When the RF coil 26 is detachable, the RF coil 26 may be an RF coil that is configured for a part of the object, such as a head RF coil, a chest RF coil, a leg RF coil, a neck RF coil, a shoulder RF coil, a wrist RF coil, or an ankle RF coil.

The RF coil 26 may communicate with an external apparatus via wires and/or wirelessly, and may also perform dual tune communication based on a corresponding communication frequency band.

The RF coil 26 may be a birdcage coil, a surface coil, or a transverse electromagnetic (TEM) coil based on corresponding structures.

The RF coil 26 may be a transmission exclusive coil, a reception exclusive coil, or a transmission and reception coil based on corresponding methods of transmitting and receiving an RF signal.

The RF coil 26 may be an RF coil which includes any of various numbers of channels, such as 16 channels, 32 channels, 72 channels, and 144 channels.

The gantry 20 may further include a display 29 disposed outside the gantry 20 and a display (not shown) disposed inside the gantry 20. The gantry 20 may provide predetermined information to the user or the object 10 via the display 29 disposed outside the gantry and via the display disposed inside the gantry 20.

The signal transceiver 30 may control the gradient magnetic field formed inside the gantry 20, i.e., in the bore, based on a predetermined MR sequence, and may control transmission and reception of an RF signal and an MR signal.

The signal transceiver 30 may include a gradient amplifier 32, a transmission and reception switch 34, an RF transmitter 36, and an RF receiver 38.

The gradient amplifier 32 drives the gradient coil 24 included in the gantry 20, and may supply a pulse signal for generating a gradient magnetic field to the gradient coil 24 under the control of a gradient magnetic field controller 54. By controlling the pulse signal supplied from the gradient amplifier 32 to the gradient coil 24, gradient magnetic fields in X-axis, Y-axis, and Z-axis directions may be synthesized.

The gradient magnetic field controller 54 according to the present exemplary embodiment may supply a pulse signal in order to additionally generate a spatial encoding gradient which includes respective magnetic field components which have gradients in each of the X-axis, Y-axis, and Z-axis directions and a gradient magnetic field in the Z-axis direction, to the gradient coil 24, via the gradient amplifier 32.

The RF transmitter 36 and the RF receiver 38 may drive the RF coil 26. The RF transmitter 36 may supply an RF pulse in a Larmor frequency to the RF coil 26, and the RF receiver 38 may receive an MR signal received by the RF coil 26.

The RF receiver 38 according to the present exemplary embodiment may receive an MR signal that includes position information which is based on the spatial encoding gradient. Further, the RF receiver 38 may receive an MR signal that includes shifted position information in the X-axis direction as the gradient magnetic field in the Z-axis direction is additionally applied to the object.

Still further, the RF receiver 38 may receive an MR signal which is undersampled in the Y-axis direction. Alternatively, the RF receiver 38 may receive an MR signal which is undersampled in a spiral direction.

The transmission and reception switch 34 may adjust transmitting and receiving directions of the RF signal and the MR signal. For example, the transmission and reception switch 34 may emit the RF signal toward the object 10 via the RF coil 26 during a transmission mode, and receive the MR signal from the object 10 via the RF coil 26 during a reception mode. The transmission and reception switch 34 may be controlled by a control signal output by an RF controller 56.

The monitoring unit 40 may monitor or control the gantry 20 or devices mounted on the gantry 20. The monitoring unit 40 may include a system monitoring unit (also referred to herein as a "system monitor") 42, an object monitoring unit (also referred to herein as an "object monitor") 44, a table controller 46, and a display controller 48.

The system monitoring unit 42 may monitor and control a state of the magnetostatic field, a state of the gradient magnetic field, a state of the RF signal, a state of the RF coil 26, a state of the table 28, a state of a device which measures body information that relates to the object 10, a power supply state, a state of a thermal exchanger, and a state of a compressor.

The object monitoring unit 44 monitors a state of the object 10. In detail, the object monitoring unit 44 may include any one or more of a camera configured for observing a movement or position of the object 10, a respiration measurer configured for measuring the respiration of the object 10, an electrocardiogram (ECG) measurer configured for measuring the electrical activity of the object 10, and/or a temperature measurer configured for measuring a temperature of the object 10.

The table controller 46 controls a movement of the table 28 upon which the object 10 is positioned. The table controller 46 may control the movement of the table 28 based on a sequence control of a sequence controller 50. For example, during moving imaging of the object 10, the table controller 46 may continuously or discontinuously move the table 28 based on the sequence control of the sequence controller 50, and thus the object 10 may be photographed in a field of view (FOV) which is larger than that of the gantry 20.

The display controller 48 controls the display 29 disposed outside the gantry 20 and the display disposed inside the gantry 20. In detail, the display controller 48 may control the display 29 and the inside display to be on or off, and may control a screen image to be output on either or both of the display 29 and the inside display. Further, when a speaker is located inside or outside the gantry 20, the display controller 48 may control the speaker to be on or off, or may control sound to be output via the speaker.

The system control unit 50 may include the sequence controller 52 for controlling a sequence of signals formed in the gantry 20, and a gantry controller 58 for controlling the gantry 20 and the devices mounted on the gantry 20.

The sequence controller 52 may include the gradient magnetic field controller 54 which is configured for controlling the gradient amplifier 32, and the RF controller 56 which is configured for controlling the RF transmitter 36, the RF receiver 38, and the transmission and reception switch 34. The sequence controller 52 may control the gradient amplifier 32, the RF transmitter 36, the RF receiver 38, and the transmission and reception switch 34 based on a pulse sequence received from the operating unit 60. In particular, the pulse sequence includes all information required to control the gradient amplifier 32, the RF transmitter 36, the RF receiver 38, and the transmission and reception switch 34. For example, the pulse sequence may include information about strength, an application time, and application timing of a pulse signal to be applied to the gradient coil 24.

The sequence controller 52 according to the present exemplary embodiment may receive a pulse sequence of a spin echo technique which pulse sequence includes an RF signal that has a plurality of frequency components, a spatial encoding gradient pulse, and a gradient pulse of the Z-axis direction, from the operating unit 60.

Further, the sequence controller 52 may receive at least one spiral RF pulse sequence that has a spiral trajectory in the k-space, from the operating unit 60.

The operating unit 60 may request the system control unit 50 to transmit pulse sequence information while controlling an overall operation of the MRI apparatus 100.

The operating unit 60 may include an image processor 62 configured for receiving and processing the MR signal received by the RF receiver 38, an output unit (also referred to herein as an "output device") 64, and an input unit (also referred to herein as an "input device") 66.

The image processor 62 may process the MR signal received from the RF receiver 38 so as to generate MR image data of the object 10.

The image processor 62 receives the MR signal received by the RF receiver 38 and performs any one of various signal processes, such as amplification, frequency transformation, phase detection, low frequency amplification, and filtering, on the received MR signal.

The image processor 62 may arrange digital data in a k-space (for example, also referred to as a Fourier space or a frequency space) of a memory, and rearrange the digital data into image data via 2D or 3D Fourier transformation.

If needed, the image processor 62 may perform a composition process or difference calculation process on the image data. The composition process may include an addition process on a pixel or a maximum intensity projection (MIP) process. The image processor 62 may store not only the rearranged image data, but also image data on which a composition process or a difference calculation process is performed, in a memory (not shown) or in an external server.

The image processor 62 may perform any of the signal processes on the MR signal in parallel. For example, the image processor 62 may perform a signal process on a plurality of MR signals received by a multi-channel RF coil in parallel so as to rearrange the plurality of MR signals into image data.

The image processor 62 according to the present exemplary embodiment may receive an undersampled MR signal and interpolate non-measured data in the k-space. For example, the image processor 62 may estimate non-measured data based on a parallel imaging technique such as, for example, GRAPPA or SENSE.

Further, the image processor 62 may separate MR signals of the slices into a respective MR signal of each slice. For example, the image processor 62 may separate the MR signals of the slices into an MR signal of each slice, based on a multi-slice imaging technique such as, for example, slice-GRAPPA or multi-slice-CAIPIRINHA. The image processor 62 may separate the MR signals of the slices based on a respective difference in the coil sensitivity information between the corresponding slices.

Still further, the image processor 62 may generate image data of each slice based on a separate MR signal.

The output unit 64 may output image data generated or rearranged by the image processor 62 to the user. The output unit 64 may also output information required in order for the user to manipulate the MRI apparatus 100, such as a user interface (UI), user information, and/or object information. The output unit 64 may include any of a speaker, a printer, a cathode-ray tube (CRT) display, a liquid crystal display (LCD), a plasma display panel (PDP), an organic light-emitting device (OLED) display, a field emission display (FED), a light-emitting diode (LED) display, a vacuum fluorescent display (VFD), a digital light processing (DLP) display, a flat panel display (FPD), a 3-dimensional (3D) display, a transparent display, and/or any one of other various output devices that are well known to one of ordinary skill in the art.

The user may input any of object information, parameter information, a scan condition, a pulse sequence, or information about image composition or difference calculation by using the input unit 66. The input unit 66 may include any of a keyboard, a mouse, a track ball, a voice recognizer, a gesture recognizer, a touch screen, and/or any one of other various input devices that are well known to one of ordinary skill in the art.

The signal transceiver 30, the monitoring unit 40, the system control unit 50, and the operating unit 60 are separate components in FIG. 11, but it will be apparent to one of ordinary skill in the art that respective functions of the signal transceiver 30, the monitoring unit 40, the system control unit 50, and the operating unit 60 may be performed by another component. For example, the image processor 62 converts the MR signal received from the RF receiver 38 into a digital signal in FIG. 1, but alternatively, the conversion of the MR signal into the digital signal may be performed by the RF receiver 38 or the RF coil 26.

The gantry 20, the RF coil 26, the signal transceiver 30, the monitoring unit 40, the system control unit 50, and the operating unit 60 may be connected to each other by wire or wirelessly, and when they are connected wirelessly, the MRI apparatus 100 may further include an apparatus (not shown) which is configured for synchronizing clock signals therebetween. Communication between the gantry 20, the RF coil 26, the signal transceiver 30, the monitoring unit 40, the system control unit 50, and the operating unit 60 may be performed by using a high-speed digital interface, such as low voltage differential signaling (LVDS), asynchronous serial communication, such as a universal asynchronous receiver transmitter (UART), a low-delay network protocol, such as error synchronous serial communication or a controller area network (CAN), optical communication, or any of other various communication methods that are well known to one of ordinary skill in the art.

Figure 12:
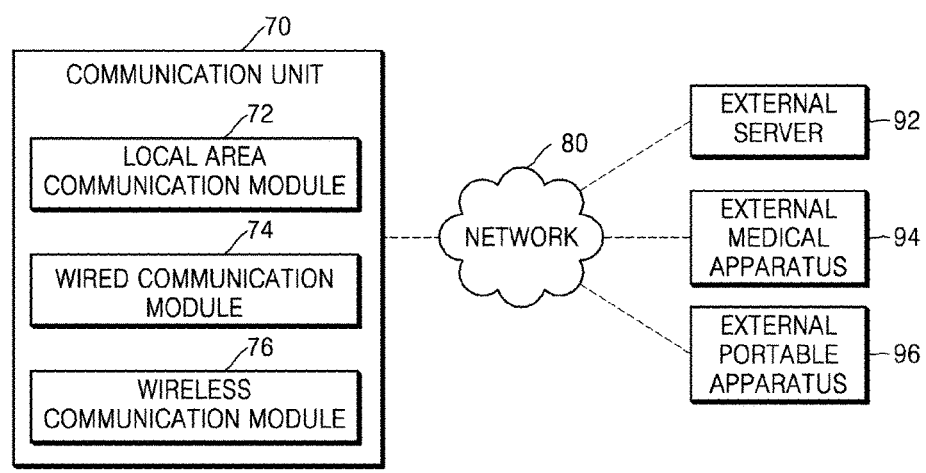
FIG. 12 is a block diagram of a communication unit, according to an exemplary embodiment.

FIG. 12 is a block diagram of the communication unit 70 according to an exemplary embodiment. Referring to FIG. 12, the communication unit 70 may be connected to at least one from among the gantry 20, the signal transceiver 30, the monitoring unit 40, the system control unit 50, and the operating unit 60 of FIG. 11.

The communication unit 70 may transmit and receive data to and from a hospital server and/or another medical apparatus in a hospital, which is connected via a picture archiving and communication system (PACS), and perform data communication according to the digital imaging and communications in medicine (DICOM) standard.

As shown in FIG. 12, the communication unit 70 may be connected to a network 80 by wire or wirelessly in order to communicate with a server 92, a medical apparatus 94, and/or a portable device 96.

In detail, the communication unit 70 may transmit and receive data related to the diagnosis of an object via the network 80, and may also transmit and receive a medical image captured by the medical apparatus 94, such as a CT apparatus, an MRI apparatus, or an X-ray apparatus. In addition, the communication unit 70 may receive a diagnosis history or a treatment schedule of the object from the server 92 and use the same to diagnose the object. The communication unit 70 may perform data communication not only with the server 92 or the medical apparatus 94 in a hospital, but also with the portable device 96, such as a mobile phone, a personal digital assistant (PDA), and/or a laptop of a doctor or patient.

Further, the communication unit 70 may transmit information which relates to a malfunction of the MRI apparatus 100 or which relates to a medical image quality to a user via the network 80, and receive a feedback regarding the information from the user.

The communication unit 70 may include at least one component configured to enable communication with an external apparatus.

For example, the communication unit 70 may include any one or more of a local area communication module 72, a wired communication module 74, and a wireless communication module 76. The local area communication module 72 refers to a module configured for performing local area communication with an apparatus within a predetermined distance. Examples of local area communication technology according to an exemplary embodiment include, but are not limited to, a wireless local area network (LAN), wireless fidelity (Wi-Fi), Bluetooth, ZigBee, Wi-Fi direct (WFD), ultra wideband (UWB), infrared data association (IrDA), Bluetooth low energy (BLE), and near field communication (NFC).

The wired communication module 74 refers to a module configured for performing communication by using an electric signal or an optical signal. Examples of wired communication technology according to an exemplary embodiment include wired communication techniques using a pair cable, a coaxial cable, and an optical fiber cable, and other well-known wired communication techniques.

The wireless communication module 76 transmits and receives a wireless signal to and from at least one from among a base station, an external apparatus, and a server in a mobile communication network. In this aspect, the wireless signal may include any of a voice call signal, a video call signal, and/or data in any one of various formats according to transmission and reception of a text/multimedia message.

The exemplary embodiments of the present inventive concept may be written as computer programs and may be implemented in general-use digital computers that execute the programs using a transitory or non-transitory computer-readable recording medium.

Examples of the non-transitory computer-readable recording medium include magnetic storage media (e.g., read-only memory (ROM), floppy disks, hard disks, etc.), optical recording media (e.g., compact disk-read-only memory (CD-ROMs), or digital versatile disks (DVDs)), etc.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. Accordingly, the above exemplary embodiments and all aspects thereof are examples only and are not limiting.

What is claimed is:

1. A magnetic resonance imaging apparatus comprising:
    a gradient magnetic field controller configured to apply a spatial encoding gradient to each of a first slice and a second slice, and to apply a slice selection gradient to each of the first slice and the second slice;
    a radio frequency (RF) receiver configured to receive a first magnetic resonance signal which relates to the first slice and which includes first shifted position information in a frequency direction as a result of the slice selection gradient being applied to the first slice and is undersampled in a phase direction, and to receive a second magnetic resonance signal which relates to the second slice and which includes second shifted position information in the frequency direction as a result of the slice selection gradient being applied to the second slice and is undersampled in a phase direction; and
    an image processor configured to generate a respective magnetic resonance image of each of the first and second slices based on the received first and second magnetic resonance signals,
    wherein:
        the first magnetic resonance signal and the second magnetic resonance signal are undersampled in a phase direction so as to exhibit overlap in a spatial domain in the phase direction, and
        the first magnetic resonance signal and the second magnetic resonance signal include information in a superposed state so as to exhibit overlap in the spatial domain in the frequency direction based on the first shifted position information and the second shifted position information.

2. The magnetic resonance imaging apparatus of claim 1, wherein the RF receiver is further configured to receive the first and second magnetic resonance signals in a superposed state in one repetition time.

3. The magnetic resonance imaging apparatus of claim 2, wherein the image processor is further configured to separate the first and second magnetic resonance signals in the superposed state, based on a difference in coil sensitivity information between the first slice and the second slice.

4. A method for generating a magnetic resonance image, the method comprising:
    applying a spatial encoding gradient to each of a first slice and a second slice;
    applying a slice selection gradient defined as a magnetic field component which includes a gradient with respect to a slice direction to each of the first slice and the second slice;
    receiving a first magnetic resonance signal which relates to the first slice and which includes first shifted position information in a frequency direction as a result of the applying the slice selection gradient to the first slice and is undersampled in a phase direction, and receiving a second magnetic resonance signal which relates to the second slice and which includes second shifted position information in the frequency direction as a result of the applying the slice selection gradient to the second slice and is undersampled in the phase direction; and
    generating a respective magnetic resonance image of each of the first and second slices based on the received first and second magnetic resonance signals,
    wherein:
        the first magnetic resonance signal and the second magnetic resonance signal are undersampled in a phase direction so as to exhibit overlap in a spatial domain in the phase direction, and
        the first magnetic resonance signal and the second magnetic resonance signal include information in a superposed state so as to exhibit overlap in the spatial domain in the frequency direction based on the first shifted position information and the second shifted position information.

5. The method of claim 4, wherein the receiving the first and second magnetic resonance signals comprises receiving the first and second magnetic resonance signals in a superposed state in one repetition time.

6. The method of claim 5, wherein the generating the respective magnetic resonance image of each of the first and second slices comprises:
    separating the first and second magnetic resonance signals in the superposed state, based on a difference in coil sensitivity information between the first slice and the second slice, and
    generating the respective magnetic resonance image of each of the first and second slices based on the separated first and second magnetic resonance signals.

7. A non-transitory computer readable storage medium having stored thereon a program, which when executed by a computer, performs the method of claim 4.

* * * * *